(12) United States Patent
Brodsky et al.

(10) Patent No.: US 7,255,571 B2
(45) Date of Patent: Aug. 14, 2007

(54) TEMPERATURE DEPENDENT SEMICONDUCTOR MODULE CONNECTORS

(75) Inventors: William L. Brodsky, Binghamton, NY (US); James A. Busby, New Paltz, NY (US); Bruce J. Chamberlin, Vestal, NY (US); Mitchell G. Ferrill, Little Meadows, PA (US); Robin A. Susko, Owego, NY (US); James R. Wilcox, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/521,158

(22) Filed: Sep. 14, 2006

(65) Prior Publication Data

US 2007/0010111 A1    Jan. 11, 2007

Related U.S. Application Data

(62) Division of application No. 10/906,810, filed on Mar. 8, 2005, now Pat. No. 7,137,826.

(51) Int. Cl.
*H01R 12/00*   (2006.01)

(52) U.S. Cl. .......................................... 439/65; 439/70
(58) Field of Classification Search .................. 439/65, 439/66, 70, 856–858
See application file for complete search history.

(56) References Cited

U.S. PATENT DOCUMENTS

| 4,022,519 A | 5/1977 | Hill |
| 4,813,807 A | 3/1989 | Mead |
| 5,572,141 A | 11/1996 | Hutton |
| 6,583,354 B2 | 6/2003 | Alcoe |
| 7,137,826 B2 * | 11/2006 | Brodsky et al. .............. 439/65 |

\* cited by examiner

*Primary Examiner*—Khiem Nguyen
(74) *Attorney, Agent, or Firm*—Gibb & Rahman, LLC; Ira Blecker, Esq.

(57) ABSTRACT

A method and structure is disclosed for forming a removable interconnect for semiconductor packages, where the connector is adapted to repeatedly change from a first shape into a second shape upon being subjected to a temperature change and to repeatedly return to the first shape when not being subjected to the temperature change. The connector can be disconnected when the connector is in its second shape and the connector cannot be disconnected when the connector is in its first shape.

19 Claims, 7 Drawing Sheets

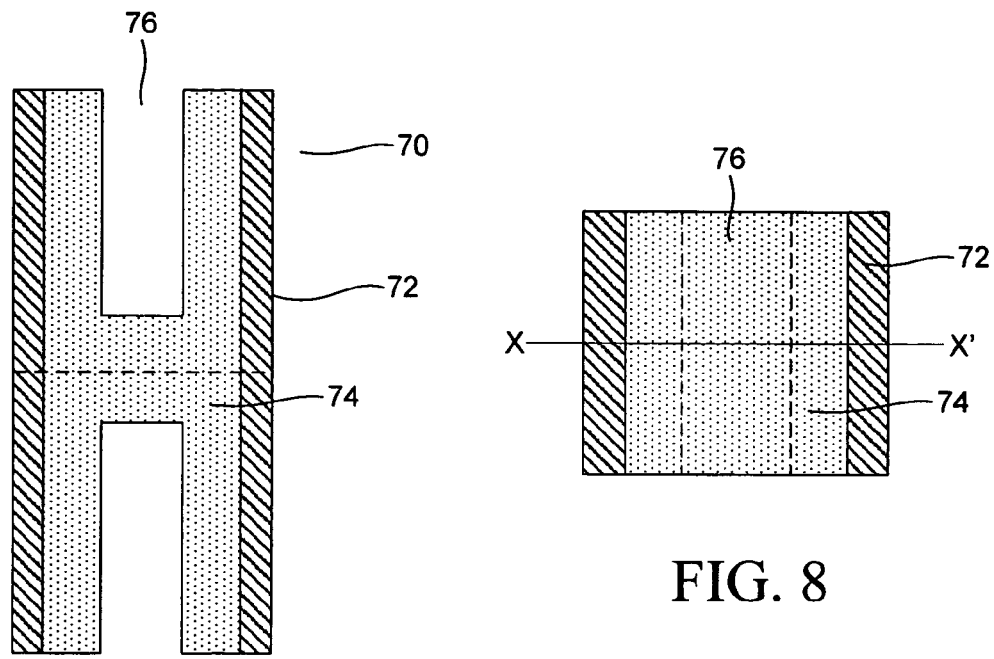
FIG. 7
FIG. 8
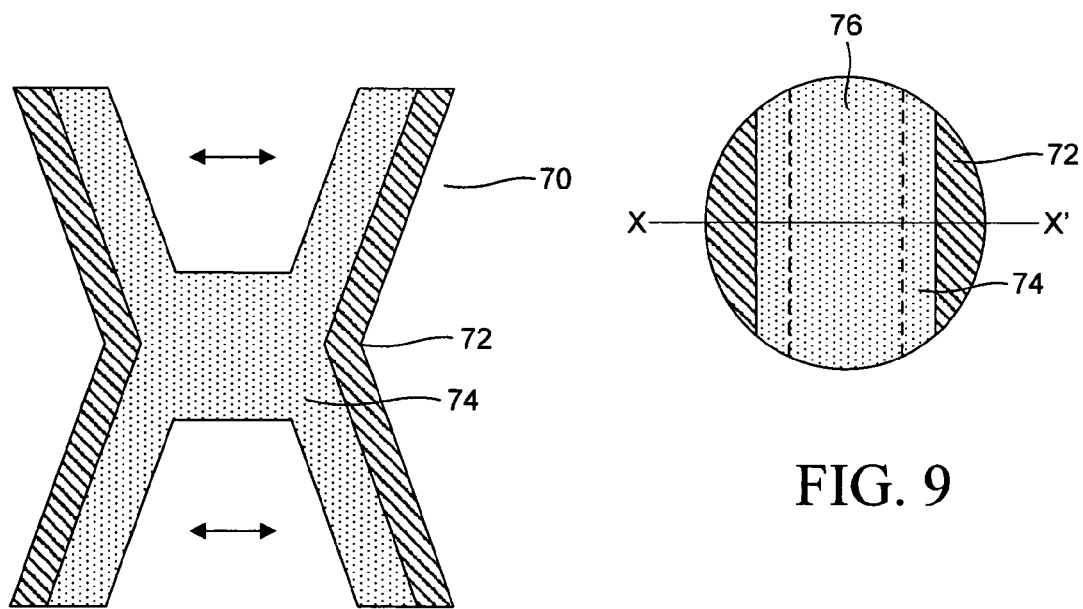
FIG. 10
FIG. 9

TEMPERATURE DEPENDENT SEMICONDUCTOR MODULE CONNECTORS

CROSS-REFERENCE TO RELATED APPLICATIONS

This Application is a division of U.S. patent application Ser. No. 10/906,810, filed Mar. 8, 2005 now U.S. Pat. No. 7,137,826.

BACKGROUND OF THE INVENTION

1. Field of the Invention

This invention details a method and structure for forming a removable interconnect for semiconductor packages, where the connector is adapted to repeatedly change from a first shape into a second shape upon being subjected to a temperature change and to repeatedly return to the first shape when not being subjected to the temperature change, and where the connector can be disconnected when the connector is in its second shape and the connector cannot be disconnected when the connector is in its first shape.

2. Description of the Related Art

Due to the high cost of semiconductors, circuit boards and systems it is desirable to provide for a method to be able to remove a semiconductor module from an assembled circuit board without damaging the board or module and thereby enable field replacement capability. At present, such capability is problematic for organic packages, since the actuation loads required in currently available removable solutions exert forces which are incompatible with the organic module structures.

Existing industry solutions for removable packaging interconnect schemes, such as Land Grid Array (LGA) assemblies, apply substantial stresses to the module being connected. Today's best organic module interconnect solution is the use of Ball Grid Array (BGA) solder connections or solderable leads to make the interconnect. Soldered interconnection schemes are not readily replaceable and factory rework processes are difficult and may impact the reliability of the assembled module, particularly in a Pb-free soldering environment. Pin Grid Array interconnects or BGA sockets do provide for more convenient module replacement but can be expensive and often impart changes to electrical parameters, such as increased inductance, that negatively impact device performance. Moreover, these solutions may not be compatible with 1 mm grid I/O pitch.

The best electrical and manufacturing solution available today is the use of Land-Grid Array (LGA) structures. The LGA provides for an array of electrical contact pads on the bottom of the module which is brought into contact with a second level socket to make electrical connections to the circuit board. The drawback here is, in order to establish reliable connections between the module and circuit board, a substantial force (roughly proportional to the number of module pads) must be applied to the interposer/module assembly. Moreover, this actuation force must be maintained for the functional life of the product. The required actuation force is typically excessive for organic semiconductor packages. The high stresses imposed on the laminate substrate structures can cause reliability concerns associated with resin cracks, warpage, inner plane separation and PTH fractures. It is desirable to alleviate the excessive actuation loads associated with a removable interconnect while maintaining manufacturability, electrical performance, reliability, field reworkability, and reasonable cost.

SUMMARY OF THE INVENTION

Disclosed is an interconnection structure (which can be an array of conductive connectors) for use between electronic substrates (such as silicon, ceramic, or organic substrates) used for integrated circuit chips and chip carriers. With the inventive interconnection, a connector is physically attached to a first substrate. The inventive connector described herein is adapted to attach to a feature (such as a topographical feature, including a solder ball, column, opening, etc.) on a second substrate. In the present context, the first or second substrate could comprise laminate printed circuit boards, chips, carriers, etc. The connector is adapted to repeatedly change from a first shape into a second shape upon being subjected to a temperature change and to repeatedly return to the first shape when not being subjected to the temperature change. Also, the connector can be disconnected from the feature when the connector is in its second shape and the connector cannot be disconnected from the feature when the connector is in its first shape.

The connector comprises a structure that repeatedly alternates between two different shapes each time it is subjected to a temperature change. The connector includes a first material and a second material, where the first material has a different coefficient of thermal expansion than the second material. For example, the connector can comprise a bi-metallic structure that utilizes two different metals having different coefficients of thermal expansion. The connector and the topographical feature can therefore form a reversible connection between the first substrate and the second substrate that can be repeatedly connected and disconnected.

The inventive connector mechanically attaches the first substrate to the second substrate and the connector can comprise an electrical conductor which also forms an electrical connection between the first substrate and second substrate. The connector is shaped to physically grasp the topographical feature. Further, the individual connectors can be retained in an interposer like structure that is either a molded element or non-conductive film.

In one embodiment, the connector can comprise a tubular connector that is adapted to repeatedly change from a smaller diameter to a larger diameter upon being subjected to a temperature change and to repeatedly return to the smaller diameter when not being subjected to the temperature change. In this embodiment, the connector can be disconnected from the feature when the connector is the larger diameter and the connector cannot be disconnected from the feature when the connector is the smaller diameter because the connector physically grasps the topographical protrusion when the connector is the smaller diameter. The connector can include a slot that is adapted to permit the connector to repeatedly change diameter. The connector can include projections adapted to surround sides of said topographical feature when the connector is the smaller diameter.

In a different embodiment, the second substrate includes an opening and the connector is adapted to attach to the opening. In this embodiment the connector changes into a smaller size upon being subjected to the temperature change such that the connector can be disconnected from the opening when the connector is the smaller size and the connector cannot be disconnected from the opening when the connector is the larger size. In this embodiment, the connector is shaped to provide an interference fit with the sidewalls of the opening when the connector is the larger size. Further, the first substrate can also include an opening similar to the opening in the second substrate which allows the connector to connect to the first substrate. The connector can be designed to allow both ends of the connector to react similarly. Alternatively, different ends of the connector can react in opposite manners. In this situation, a first type of temperature change (e.g., an increase in temperature from normal operations temperature) allows the connector to connect and disconnect from the first substrate and an opposite type of temperature change (e.g., a decrease in temperature from normal operating temperature) allows the connector to connect and disconnect from the second substrate.

Thus, the invention produces interconnections that are reworkable by use of temperature, either heating or cooling, that is dependent on the materials selected and the interconnection scheme in use. Because the invention utilizes a mechanical connection, there is no solder to remove and minimal retention hardware (applied force) is needed since the interconnections are self retaining. Thus, the invention provides an interconnection that can be permanent or temporary. For example, the invention can be used during burn in, or for permanent attachment with the possibility of component replacement after substantial usage in the field.

These, and other, aspects and objects of the present invention will be better appreciated and understood when considered in conjunction with the following description and the accompanying drawings. It should be understood, however, that the following description, while indicating embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which:

FIG. 7 is a cross-sectional schematic diagram of a connector;

FIG. 8 is a top view schematic diagram of a connector;

FIG. 9 is a top view schematic diagram of a connector;

FIG. 10 is a cross-sectional schematic diagram of a connector;

DETAILED DESCRIPTION OF PREFERRED EMBODIMENTS OF THE INVENTION

Figure 1:
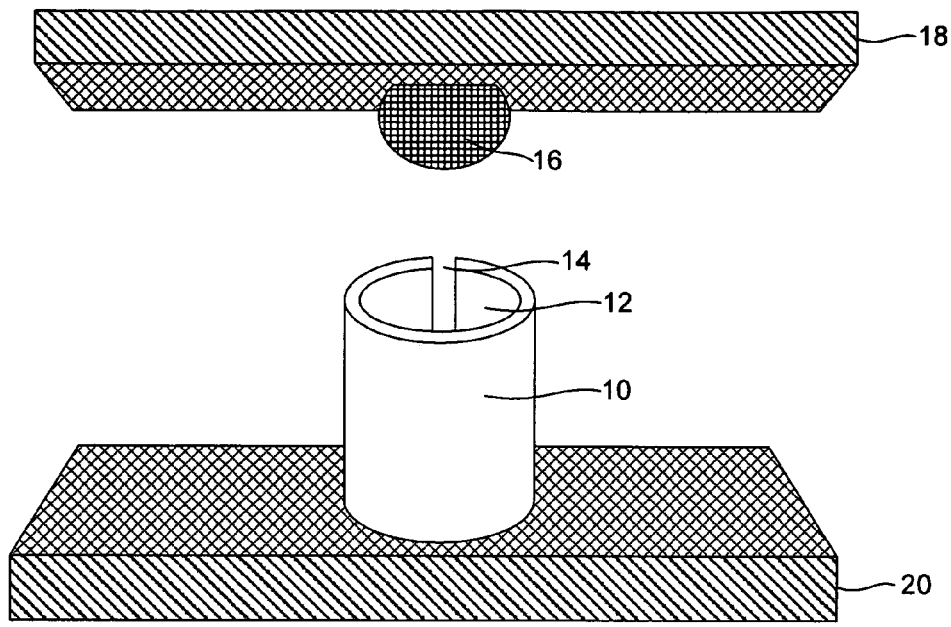
FIG. 1 is a perspective schematic diagram of a single connection element between substrates in the disengaged condition.

The present invention and the various features and advantageous details thereof are explained more fully with reference to the nonlimiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

Figure 2:
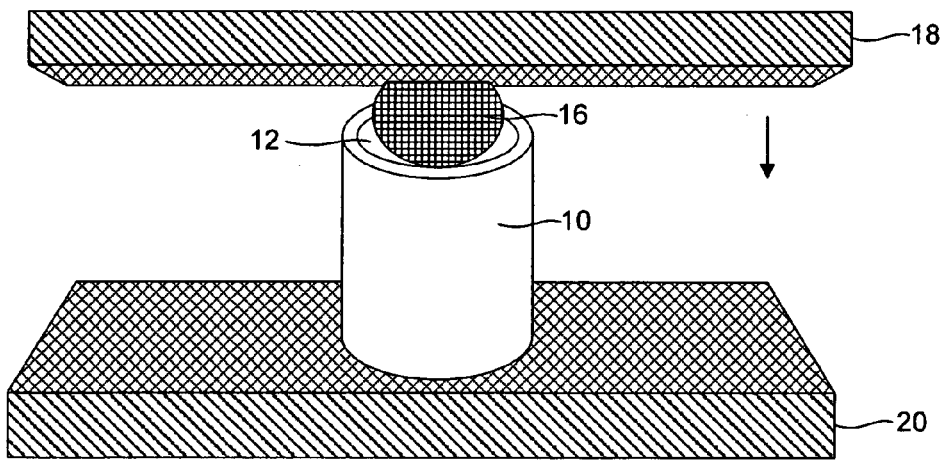
FIG. 2 is a perspective schematic diagram of a single connection element between substrates in the engaged condition.

In order to overcome the problems discussed above, the invention presents an interconnection for use between substrates (such as silicon, ceramic, organic, etc. substrates 18, 20 shown in FIG. 1). These substrates 18, 20 are generally used for integrated circuit chips, chip carriers, printed circuit boards, etc. With the inventive interconnection shown in FIG. 1, an individual connector element 10 is attached to a first substrate 20. The connector 10 can be conductive, and has an opening 12 that is adapted to attach to a feature 16 (such as a topographical feature, including a solder ball, column, patterned feature, opening, etc.) on a second substrate 18, as shown in FIG. 2. The connector 10 is shaped to physically grasp the topographical feature 16. Thus, the inventive connector 10 mechanically attaches (through frictional and/or mechanical forces) the first substrate 20 to the second substrate 18, without the need for a chemical bond, adhesive, solder, etc. However, adhesives or solders can be used on one or more of the mating substrates if desired. Such connector elements would most commonly be implemented in large arrays to provide both signal and power connections for semiconductor modules.

The methodologies and materials used to form the inventive aspects discussed herein include common patterning, metallurgical bonding, soldering, etc. techniques that are well-known to those ordinarily skilled in the art. Any techniques and materials of forming such structures (whether now known or developed in the future) can be utilized with the invention. A detailed discussion of the same is not provided herein so as to allow the reader to focus on the salient features of the invention.

Figure 3:
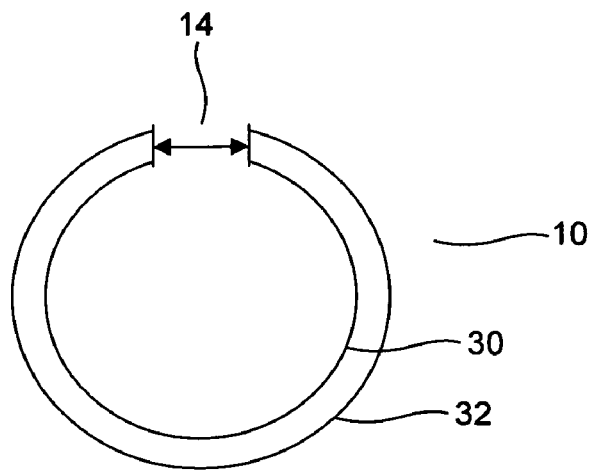
FIG. 3 is a top view schematic diagram of a single connector element.

As shown in top view in FIG. 3, the connector 10 may include layers 30, 32 of materials having different coefficients of thermal expansion and is therefore adapted to repeatedly change from an original first shape into a second shape upon being subjected to a temperature change and to repeatedly (without damage) return to the original shape when not being subjected to the temperature change. This temperature change can be an increase or decrease (for example, greater than 20° C. from a normal operating temperature and ambient temperature of the interconnection). For purposes of this application, the "normal operating temperature" is the range of temperatures at which the device that uses the inventive interconnection can properly operate. For example, if a heat generating device (such as an integrated circuit chip) normally operates between 25° C. and 125° C. and normal ambient temperature is between −20° C. and 45° C., temperatures outside the normal operating temperature and ambient temperature would be below −20° C. and above 125° C. The foregoing temperature ranges are only an example and one ordinarily skilled in the art would understand that the inventive structure can be designed to be used with any temperature ranges. For example, burn-in occurs at a higher temperature of about 140° typically. The range of the change in size and/or shape of the connector 10 is selected such that the connector 10 can only be disconnected from the feature 16 when the connector 10 is in its second shape and the connector 10 cannot be disconnected from the feature 16 when the connector 10 is in its original shape.

The connector 10 comprises a structure that repeatedly changes shape each time it is subjected to a temperature change without damage. Therefore, as shown in FIG. 3, the connector 10 includes a first material 30 attached to a second material 32, where the first material 30 has a different coefficient of thermal expansion than the second material 32. For example, the connector 10 can comprise a bimetallic structure that utilizes two metals having different coefficients of thermal expansion. Alternatively, non-metallic materials or a combination of non-metallic and metallic materials (whether now known or developed in the future) can be used as the first and second materials 30, 32.

The tubular connector 10 can be constructed so that it expands when it is heated or alternatively constructed so that it expands when it is cooled. For example, if the material 30 has a larger coefficient of thermal expansion than the material 32, when the connector 10 is heated it will expand and the connector 10 will contract when it returns to normal operating or ambient temperature, or is cooled further. To the contrary, if the material 30 has a smaller coefficient of thermal expansion than the material 32, when the connector 10 is cooled below normal operating temperature, or ambient temperature, it opens; and closes when it warms back to ambient/normal operating temperature or is heated further.

The amount by which the connector 10 expands and contracts and the temperature at which it does so can be selected to correspond to any specific design through material selection, concentration, thickness, etc. through methods well-known to those ordinarily skilled in the art. In addition, the materials of the connector 10 are selected such that the connector 10 will survive all temperature extremes to which it likely will experience, so that the connector 10 can repeatedly expand and contract without damage to allow the substrates 18, 20 to be repeatedly connected and disconnected from one another. The coefficients of thermal expansion of the materials used for the connector are selected such that the connector will remain in the original first shape/diameter throughout the anticipated ambient temperature and normal operating temperature, so that the connector 10 remains attached to the feature 16 during normal operations and handling. A temperature outside the range of ambient temperature and normal operating temperature must be applied to the connector 10 in order to cause the connector 10 to change shape/diameter to the second shape/diameter to allow the feature 16 be removed from the connector 10 during replacement associated with field service, product burn-in, field upgrade, etc. Therefore, as shown in FIG. 2, the connector 10 and the feature 16 form a separable (possibly conductive) connection between the first substrate 20 and the second substrate 18 that can be repeatedly connected and disconnected without damaging the connector 10, the feature 16, or either substrate 18, 20.

Figure 4:
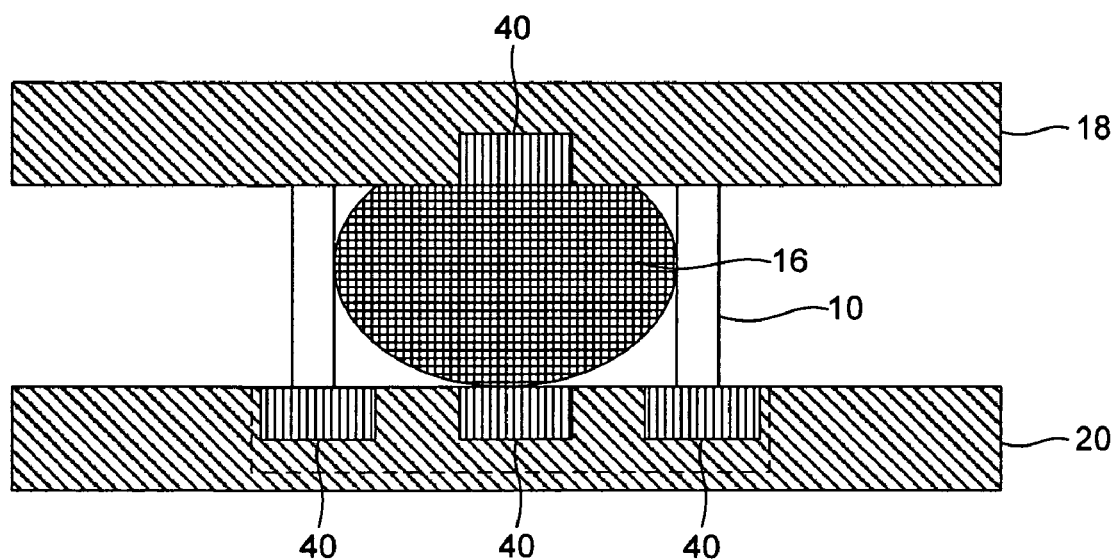
FIG. 4 is a cross-sectional schematic diagram of a connection between substrates.
Figure 6:
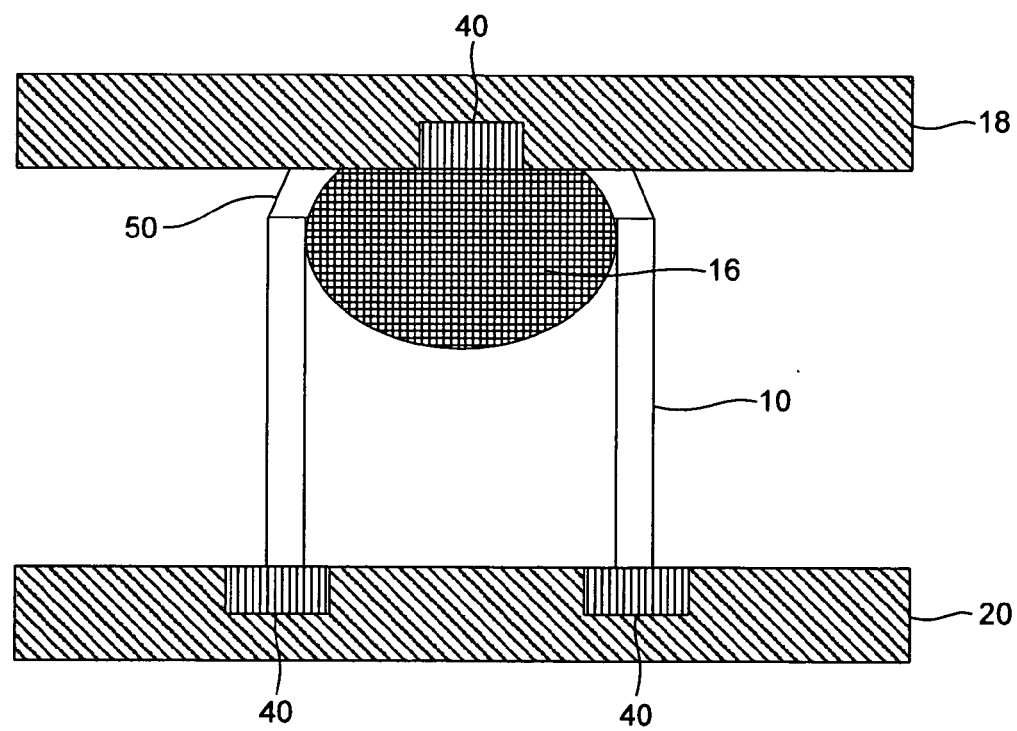
FIG. 6 is a cross-sectional schematic diagram of a connection between substrates.

Further, as shown in cross-sectional view in FIG. 4, and the connector 10 can comprise an electrical conductor which also forms an electrical connection between wiring 40 in the first substrate 20 and second substrate 18. If the connector 10 is conductive, the wiring 40 can be in direct contact with the connector. Similarly, if the feature 16 is conductive, it can be connected to the wiring in the first substrate 20 as shown in FIG. 4. However, the feature 16 does not need to contact the first substrate 20 as shown in FIG. 6. Alternately, the wiring can be continuous under the connector 10 and the feature 16 as shown by the dashed line in FIG. 4.

In the embodiment shown in FIGS. 1-4, the connector 10 can comprise a tubular connector 10 that is adapted to repeatedly change from a smaller diameter to a larger diameter upon being subjected to a temperature change and to repeatedly return to the smaller diameter when not being subjected to the temperature change. In the embodiment shown in FIGS. 1-4, the connector 10 can be disconnected from the feature 16 when the connector 10 is the larger diameter and the connector 10 cannot be disconnected from the feature 16 when the connector 10 is the smaller diameter because the connector 10 physically grasps the topographical protrusion 16 when the connector 10 is the smaller diameter. The connector 10 can include a slot 14 that is adapted to permit the connector 10 to repeatedly change diameter without damage.

Therefore, the embodiment shown in FIGS. 1-4 includes a mini sleeve-like structure which slips over one module ball or column and can 'grab' onto the module ball or column. The grabber (connector 10) can be, for example, a bimetallic structure which consistently changes shape with temperature (a product of the bi-metallic structure itself). In this example, the grabber 10 opens up during an elevated temperature (significantly above operational temperatures for the assembly, but below any critical temperature for the module, ball or column), allowing the ball or column 16 to be inserted, and when the temperature is lowered, the bimetallic returns to its original state, closing and 'grabbing' the ball or column 16.

Figure 5:
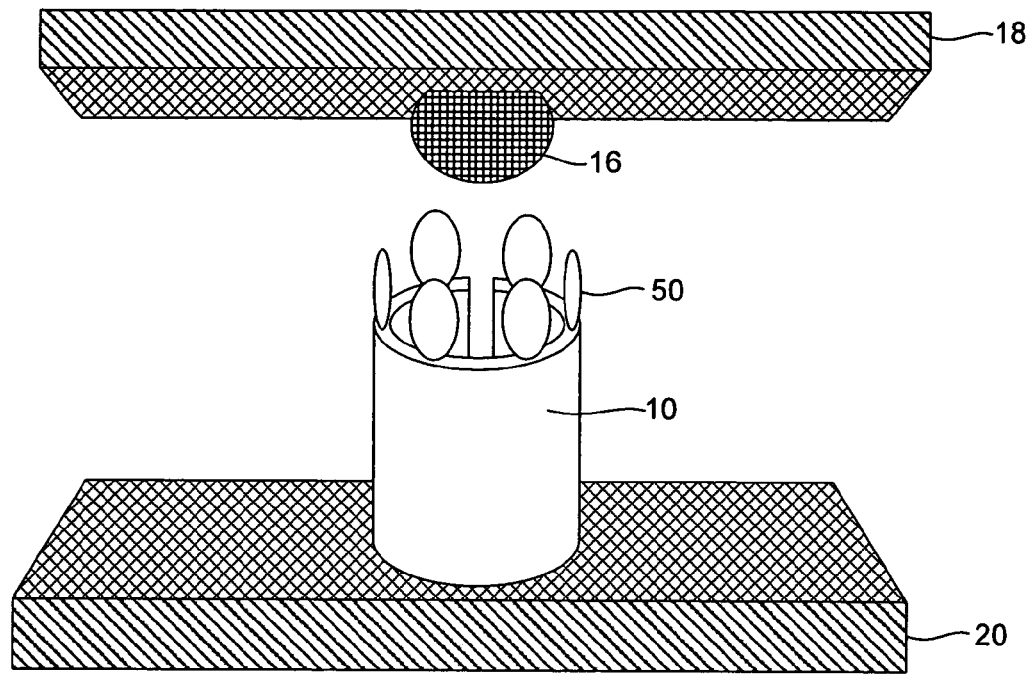
FIG. 5 is a perspective schematic diagram of a connection between substrates.

In addition, as shown in FIGS. 5 and 6, the connector 10 can include eagle claw-like or flower-like projections 50 adapted to surround sides of the feature 16 when the connector 10 is the smaller diameter. The projections 50 can comprise features attached to the tubular connector or can comprise an integral patterned part of the connector 10. FIG. 5 illustrates a perspective view before the connector 10 is attached to the feature 16. FIG. 6 illustrates a cross sectional view illustrating the projections 50 wrapping around the feature 16, thereby mechanically grasping the feature 16. When compared to the embodiment shown in FIGS. 1-4, the embodiment shown in FIGS. 5 and 6 provides additional interconnection strength by not only grasping the sides of the feature 16 using the tubular portion 10, but also by wrapping around the rounded feature 16. In the embodiment shown in FIGS. 1-6, the connector 10 is permanently attached (bonded, soldered, etc.) to the first substrate 20 and is selectively connected to the feature 16 on the second substrate 18. However, in the following embodiment, the connector (which is labeled 70 in the following embodiment) can be temporarily connected to both substrates 18, 20.

Figure 11:
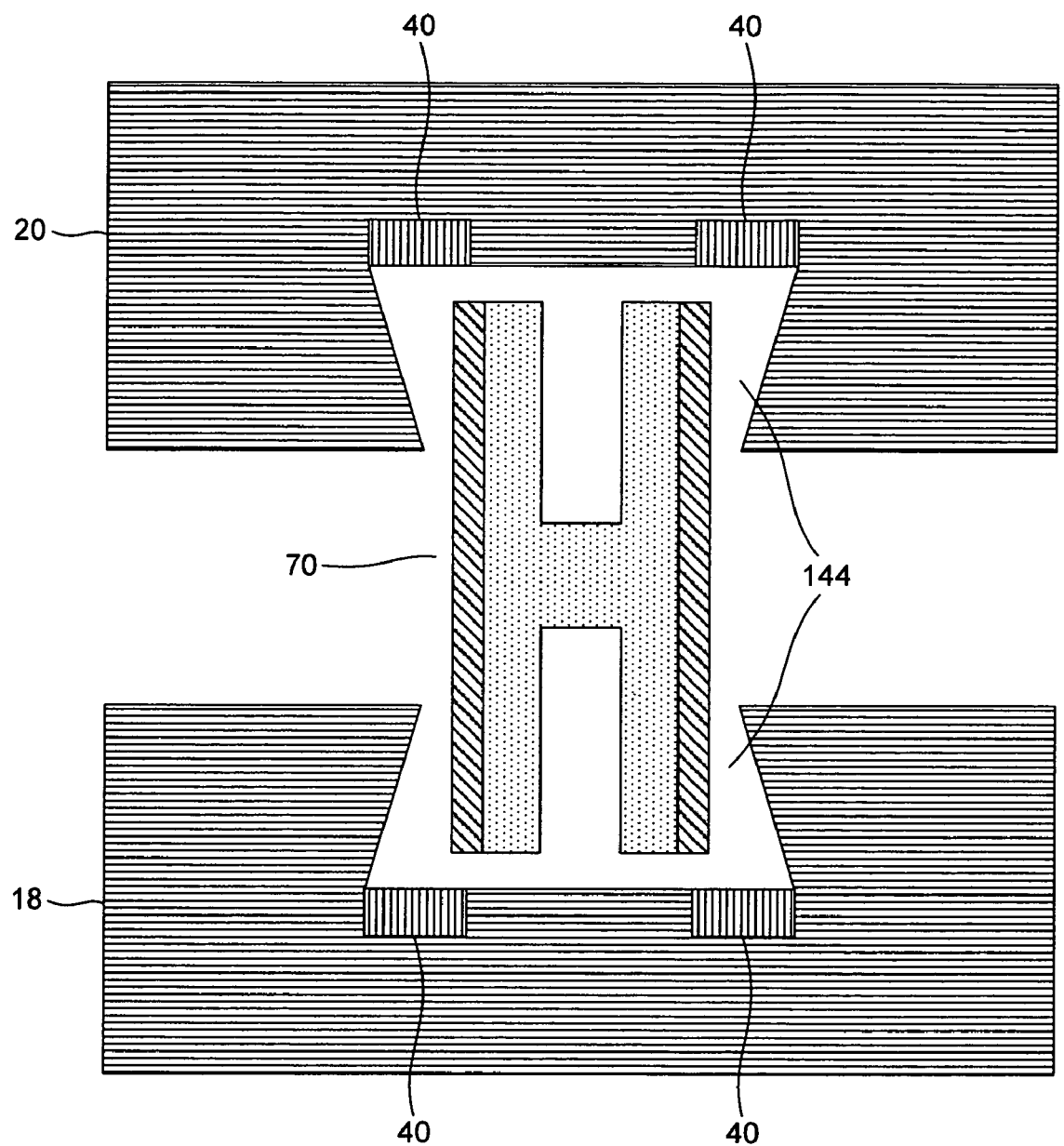
FIG. 11 is a cross-sectional schematic diagram of a connection between substrates.
Figure 12:
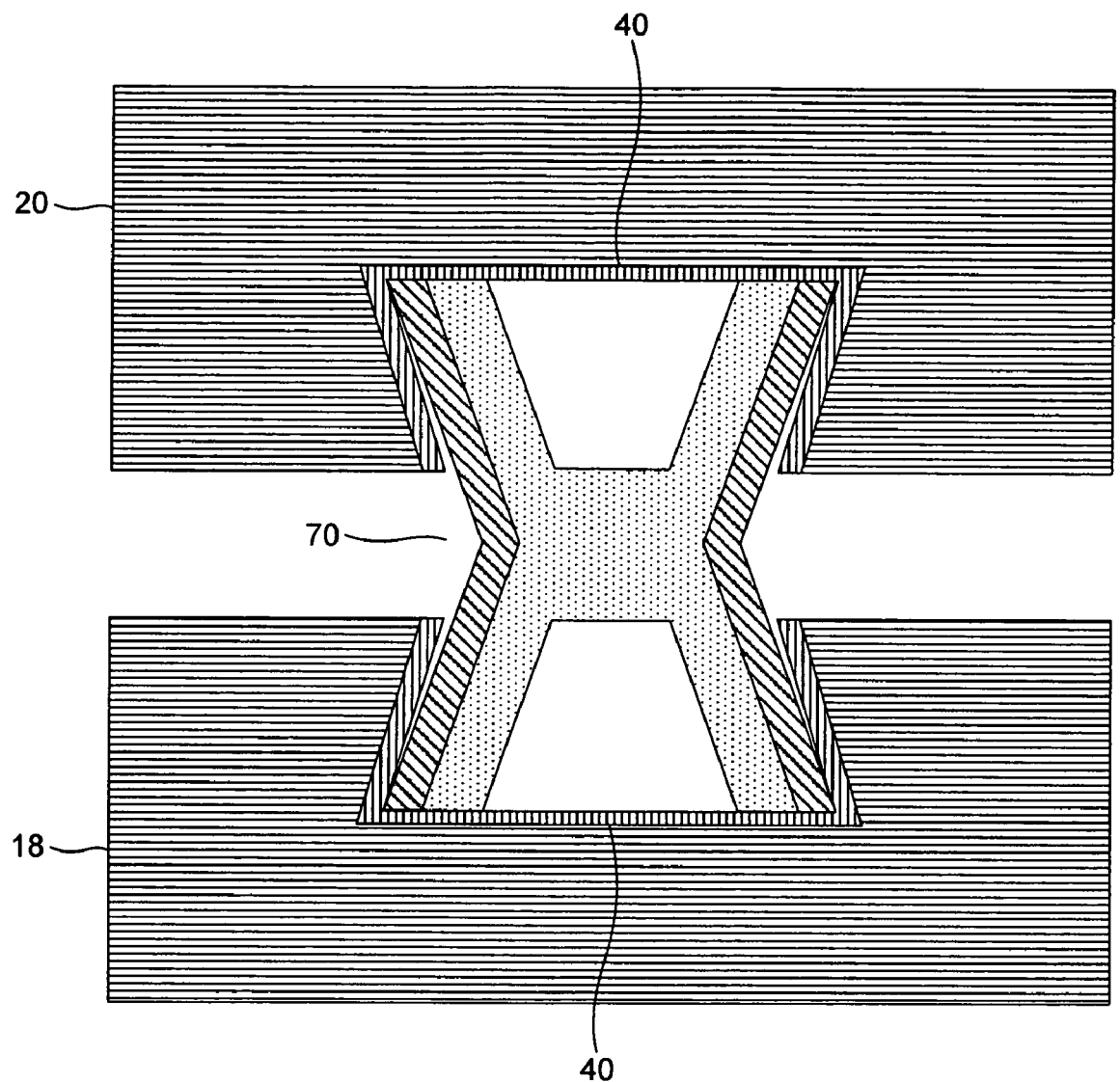
FIG. 12 is a cross-sectional schematic diagram of a connection between substrates.

More specifically, in the embodiment shown in FIGS. 7-12, the second substrate 18 includes an opening 114 and the connector 70 is adapted to expand within the opening 114 so as to attach to the opening 114 (see FIG. 12). In this embodiment the connector 70 changes into a smaller size upon being subjected to the temperature change such that the connector 70 can be disconnected from the opening 114 when the connector 70 is the smaller size and the connector 70 cannot be disconnected from the opening 114 when the connector 70 is the larger size. In this embodiment, the connector 70 is shaped to provide an interference fit with the sidewalls of the opening 114 when the connector 70 is the larger size. Fabricating the opening 114 with conductive sidewalls will further provide for electrical contact across the connection formed when connector 70 is fully engaged.

FIG. 7 illustrates a cross sectional view of the connector 70 when it is the smaller size and FIG. 10 illustrates a cross sectional view of the connector 70 when it is the larger size. Thus, when the connector 70 is heated or cooled outside ambient temperature and normal operating temperature, it takes the shape illustrated in FIG. 7. At ambient temperature and normal operating temperature, the connector takes the shape shown in FIG. 10. The connector 70 can comprise a beam or rectangular shape, as shown in top view in FIG. 8. Alternatively, the connector 70 can comprise a cylinder shape, as shown in top view in FIG. 9. The cross-sectional views shown in FIGS. 7 and 10 are drawn along lines X-X' in FIGS. 8 and 9. In addition, the claw-like or flower-like projections 50 shown in the previous embodiment can be designed to expand when at ambient temperature and normal operating temperature, so that the connector 10 can be inserted into an opening and maintained within the opening while the projections expand outward. p Thus, this embodiment illustrates a "split pin" structure. As the pin is kept at ambient and normal operating temperature, the opposite ends to move in opposite directions, expanding the shape and size of the pin. As the pin is heated or cooled outside ambient and normal operating temperature, the end(s) narrow/close, allowing the pin to be inserted into a via or opening. After the pin is inserted into the via/hole in the module, it is allowed to return to ambient and/or normal operating temperature, causing the end of the pin to open, grabbing the inside of the via and providing a connection.

The connector itself again includes one material 74 having a first coefficient of thermal expansion lined with an exterior second material 72 having a different coefficient of thermal expansion. In addition a slot, trench, slit, etc. 76 is molded, patterned, machined, etc. into the connector 70 to allow the sides of the connector to separate as shown in FIG. 10. Further, the connector 70 can be divided into a top half and bottom half, as shown by the dotted line in FIG. 7, with the top half reacting differently to a temperature change than the bottom half. For example, the top half could contract when heated, while the bottom half could contract when cooled. In this situation, a first type of temperature change (e.g., an increase in temperature) allows the connector 70 to connect and disconnect from the first substrate 20 and a second, opposite type of temperature change (e.g., a decrease in temperature) allows the connector 70 to connect and disconnect from the second substrate 18. This would allow the connector 70 to be selectively connected/disconnected to one substrate 18 will being cooled, and selectively connected/disconnected to the second substrate 20 will being heated. This feature of the invention allows the connector to be connected to the substrates at different manufacturing processing steps, thereby providing more flexibility in manufacturing, testing, and servicing.

The opening 114 can take on any appropriate shape. For example, the opening 114 can be rectangular, or as shown in FIGS. 11 and 12 can match the shape of the expanded connector 70. In this example, since the end of the connector 70 takes on a trapezoidal shape in cross-section, the opening 114 can also be formed as a trapezoidal shape to match the expanded shape of the connector 70. In addition, in this embodiment, both substrates 18, 20 can include openings 114. Alternatively, the connector 70 could be permanently attached to one of the substrates and selectively connected to the other substrate, as with the previous embodiments. In addition, as shown in FIG. 12, in all the embodiments herein, the wiring 40 can line the openings 114 to provide additional contact area for a conductive connector 70.

Figure 13:
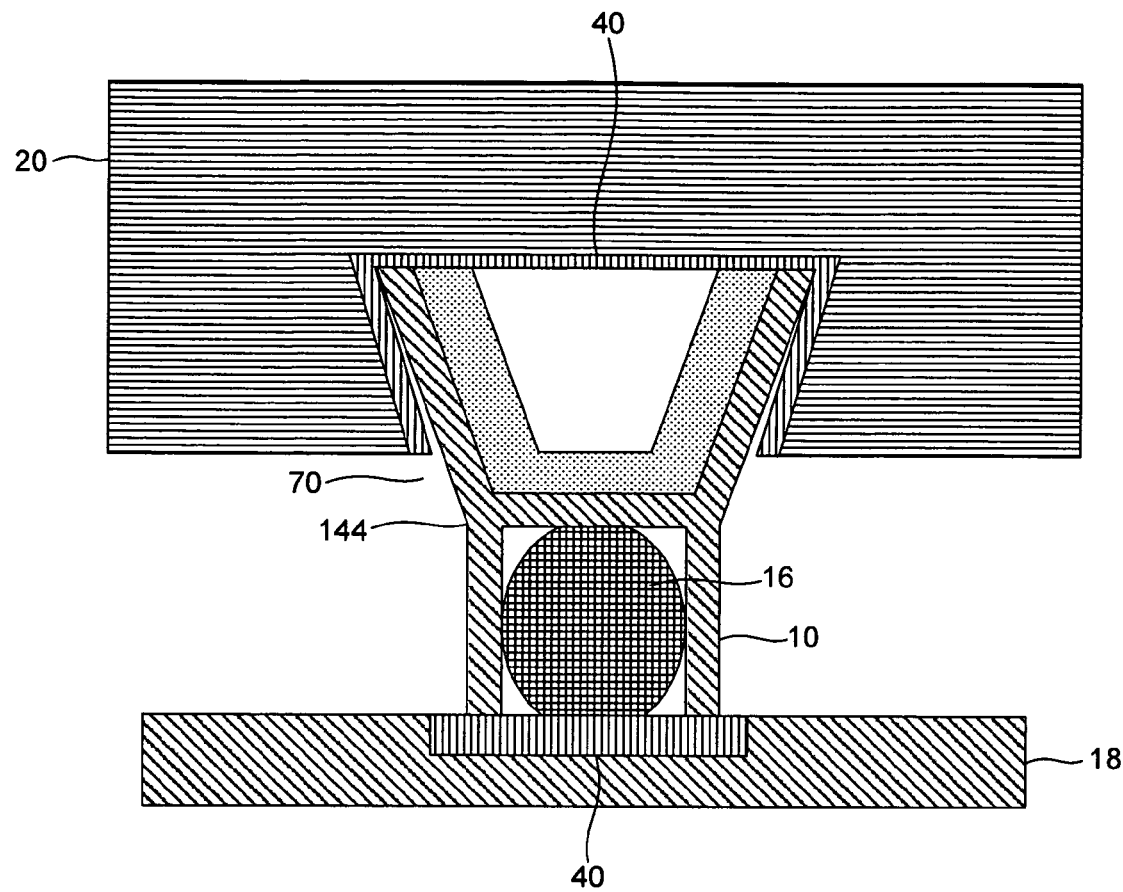
FIG. 13 is a cross-sectional schematic diagram of a connection between substrates.
Figure 14:
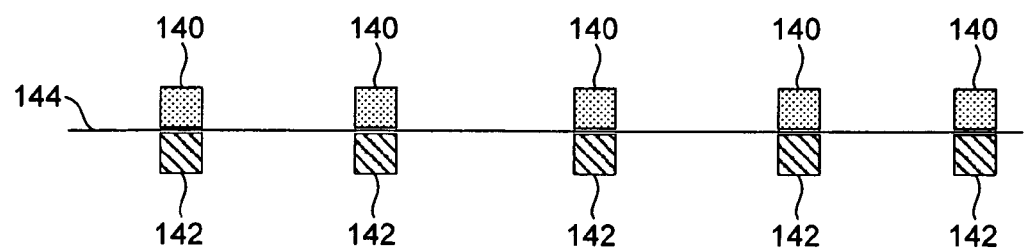
FIG. 14 is a cross-sectional schematic diagram of connectors on an interposer.

Any of the foregoing structures can be combined such that one structure is used to attach to one substrate and a different type of structure is used to attach to the other substrate. For example, as shown in FIG. 13, the top half of the connector could be similar to the split pin structure shown in FIGS. 7-12, and the bottom half of the connector could be similar to the tubular connector and illustrated in FIGS. 1-6. This structure (and any of the foregoing structures) can be formed using an interposer 144 as shown in FIGS. 13 and 14. With the invention, either entire connectors, or half-connector structures can be temporarily or permanently connected to the interposer 114.

In an example shown in FIG. 14, the top half of one type of connector 140 is connected to one side of the interposer 144 and the bottom half of a different type of connector 142 is connected to the other side of the interposer 144. The interposer 144 could be an insulator which would prevent the interposer 144 from causing unintended short circuits if the interposer 144 were to remain in the final structure or it could be a connector if it is utilized between two conductive connectors to allow the connectors to remain in electrical contact.

The interposer 144 is useful in arranging multiple connectors into an array format. Thus, the interposer can be utilized as a surface on which the connectors can be manufactured. Then, an interposer holding an array of manufactured connectors can be positioned to allow the connectors to be permanently or temporarily connected to one substrate. Then, the interposer can be removed (or the interposer can remain on the structure). Next, after the array of connectors have been connected to one substrate, a second substrate can be brought into position such that the connectors can be permanently or temporarily connected to the second substrate. Thus, as shown above, the interposer 144 can be used only as a temporary holding device to manufacture and position the connectors, or the interposer 144 can remain as a permanent part of the final structure. Further, as discussed above, the interposer can comprise a conductor or an insulator.

Thus, the invention produces interconnections that are reworkable by use of temperature, either heating or cooling, that is dependent on the materials selected and the interconnection scheme in use. Because the invention utilizes a mechanical connection, there is no solder to remove and minimal retention hardware (applied force) is needed since the interconnections are self retaining. Thus, the invention provides an interconnection that can be permanent or temporary. For example, the invention can be used during burn-in or for permanent attachment with the possibility of component replacement after substantial usage in the field.

With proper selection of bimetallic materials and combinations thereof, one can design a system that can be easily assembled and/or reworked at elevated or cryogenic temperatures, be self-retaining and potentially field replaceable, yet not exert undue retention force on the module. The invention is also advantageous because it permits the interconnection to be disconnected by being cooled, which substantially reduces the possibility of overheating either structure (which could melt or destroy thermally sensitive (soldered) connections). Other applications of the invention include both die and module burn-in. The invention is useful with practically all known interconnection schemes.

While the invention has been described in terms of preferred embodiments, those skilled in the art will recognize that the invention can be practiced with modification within the spirit and scope of the appended claims.

What is claimed is:

1. An interconnection between substrates, said interconnection comprising:
   a connector attached to a first substrate; and
   an opening in a second substrate, wherein said connector is adapted to attach to said opening,
   wherein said connector is adapted to repeatedly change from a larger size into a smaller size upon being subjected to a temperature change and to repeatedly return to said larger size when not being subjected to said temperature change, and
   wherein said connector can be disconnected from said opening when said connector is said smaller size and said connector cannot be disconnected from said opening when said connector is said larger size.

2. The interconnection according to claim 1, wherein said connector comprises a first material and a second material, wherein said first material has a different coefficient of thermal expansion than said second material.

3. The interconnection according to claim 1, wherein said connector comprises an electrical conductor.

4. The interconnection according to claim 1, wherein said connector is shaped to provide an interference fit with the sidewalls of said opening when said connector is said larger size.

5. The interconnection according to claim 1, further comprising an opening in said first substrate, wherein said connector is adapted to attach to said opening in said first substrate.

6. The interconnection according to claim 1, wherein a first type of temperature change allows said connector to connect and disconnect from said first substrate and a second type of temperature change allows said connector to connect and disconnect from said second substrate.

7. An interconnection between substrates, said interconnection comprising:
   a split-pin shaped connector attached to a first substrate; and
   an opening in a second substrate, wherein said connector is adapted to attach to said opening,
   wherein said connector is adapted to repeatedly change from a trapezoidal shape having a larger size into a rectangular shape having a smaller size upon being subjected to a temperature change and to repeatedly return to said larger size when not being subjected to said temperature change, and
   wherein said connector can be disconnected from said opening when said connector is said smaller size and said connector cannot be disconnected from said opening when said connector is said larger size.

8. The interconnection according to claim 7, wherein said connector comprises a first material and a second material, wherein said first material has a different coefficient of thermal expansion than said second material.

9. The interconnection according to claim 7, wherein said connector comprises an electrical conductor.

10. The interconnection according to claim 7, wherein said connector is shaped to provide an interference fit with the sidewalls of said opening when said connector is said larger size.

11. The interconnection according to claim 7, further comprising an opening in said first substrate, wherein said connector is adapted to attach to said opening in said first substrate.

12. The interconnection according to claim 7, wherein a first type of temperature change allows said connector to connect and disconnect from said first substrate and a second type of temperature change allows said connector to connect and disconnect from said second substrate.

13. An interconnection between substrates, said interconnection comprising:
    a connector;
    a first substrate having a first opening, wherein said connector is adapted to attach to said first opening; and
    a second substrate having a second opening, wherein said connector is adapted to attach to said second opening,
    wherein said connector is adapted to repeatedly change from a larger size into a smaller size upon being subjected to a temperature change and to repeatedly return to said larger size when not being subjected to said temperature change, and
    wherein said connector can be disconnected from said first opening and said second opening when said connector is said smaller size and said connector cannot be disconnected from said first opening or said second opening when said connector is said larger size.

14. The interconnection according to claim 13, wherein said connector comprises a first material and a second material, wherein said first material has a different coefficient of thermal expansion than said second material.

15. The interconnection according to claim 13, wherein said connector comprises an electrical conductor.

16. The interconnection according to claim 13, wherein said connector is shaped to provide an interference fit with the sidewalls of said first opening and said second opening when said connector is said larger size.

17. The interconnection according to claim 13, wherein said connector has a first half adapted to connect to said first substrate and a second half adapted to connect to said second substrate.

18. The interconnection according to claim 17, wherein said first half has a different shape than said second half.

19. The interconnection according to claim 13, wherein a first type of temperature change allows said connector to connect and disconnect from said first opening and a second type of temperature change allows said connector to connect and disconnect from said second opening.

* * * * *